United States Patent [19]
Hoffmann et al.

[11] Patent Number: 5,308,463
[45] Date of Patent: May 3, 1994

[54] PREPARATION OF A FIRM BOND BETWEEN COPPER LAYERS AND ALUMINUM OXIDE CERAMIC WITHOUT USE OF COUPLING AGENTS

[75] Inventors: Bernhard Hoffmann, Bad Homburg; Hartwig Gernoth, Viernheim, both of Fed. Rep. of Germany

[73] Assignee: Hoechst Aktiengesellschaft, Frankfurt am Main, Fed. Rep. of Germany

[21] Appl. No.: 943,503

[22] Filed: Sep. 11, 1992

[30] Foreign Application Priority Data

Sep. 13, 1991 [DE] Fed. Rep. of Germany ....... 4130518

[51] Int. Cl.⁵ .............................................. C23C 14/34
[52] U.S. Cl. .................................................. 204/192.3
[58] Field of Search .................................... 204/192.3

[56] References Cited

U.S. PATENT DOCUMENTS 4,964,962 10/1990 Nobutani et al. ................. 204/192.3

FOREIGN PATENT DOCUMENTS 0351533 1/1990 European Pat. Off. .
3036128 8/1983 Fed. Rep. of Germany .
3824249 1/1990 Fed. Rep. of Germany .

OTHER PUBLICATIONS

Patent Abstracts of Japan, vol. 12, No. 372 (C-533), Oct. 5, 1988, No. 63-121651(A).
Patent Abstracts of Japan, vol. 13, No. 63 (C-568), Feb. 13, 1989, No. 63-255360(A).

Primary Examiner—Aaron Weisstuch
Attorney, Agent, or Firm—Curtis, Morris & Safford

[57] ABSTRACT

A process for preparing a firm bond between copper layers and aluminum oxide ceramic without coupling agent layers wherein the aluminum oxide ceramic is subjected to a plasma etching process in a first vacuum chamber in the presence of oxygen and immediately thereafter plated with copper by sputtering in a second vacuum chamber.

13 Claims, 1 Drawing Sheet

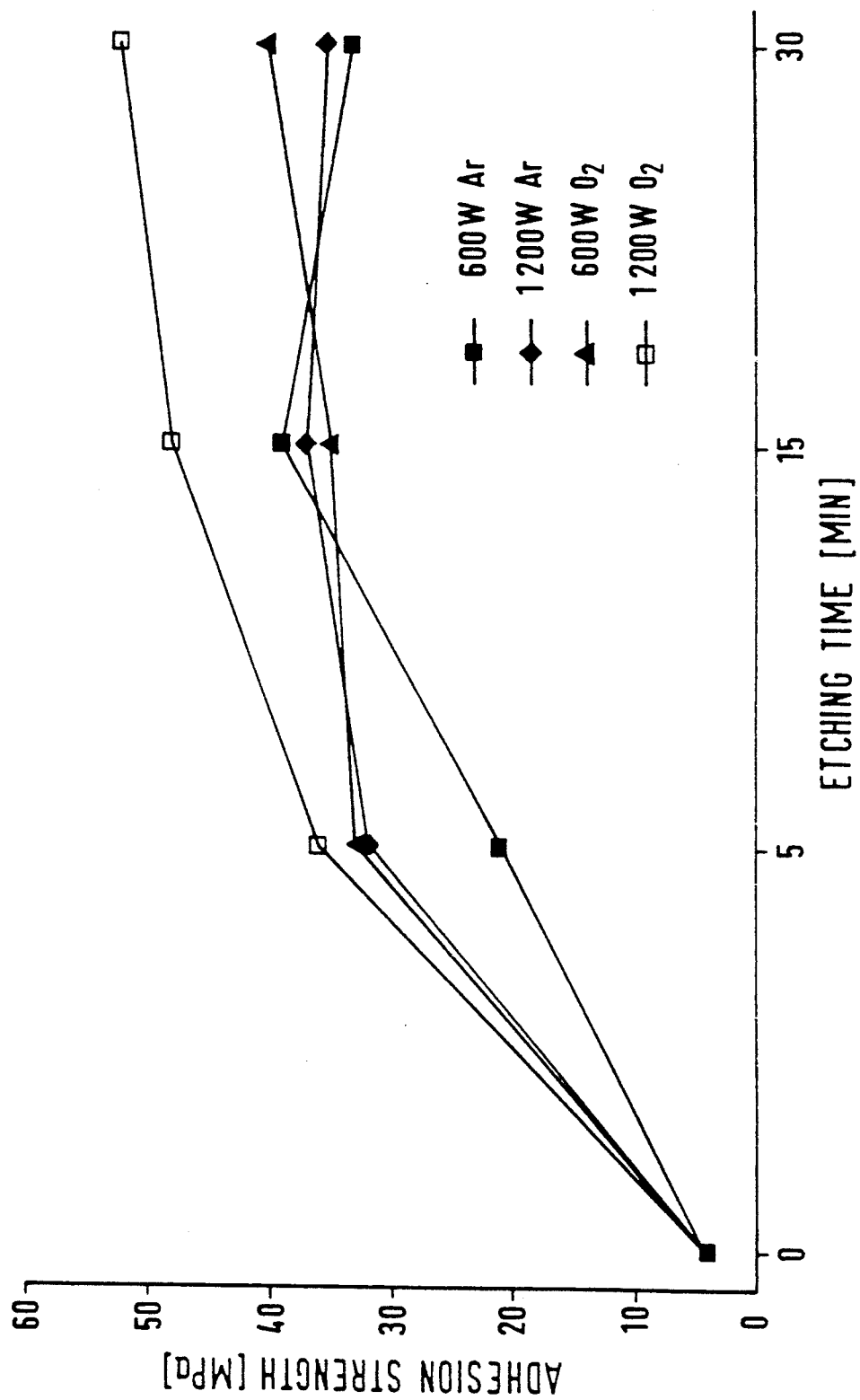

PREPARATION OF A FIRM BOND BETWEEN COPPER LAYERS AND ALUMINUM OXIDE CERAMIC WITHOUT USE OF COUPLING AGENTS

FIELD OF THE INVENTION

The invention relates to a process for preparing a firm bond between copper layers applied by sputtering and aluminum oxide ceramic.

BACKGROUND OF THE INVENTION

In the field of electronic components, the bonding of copper, a metal having very good electroconductive properties, to aluminum oxide ceramic, an electrical insulator but good thermal conductor, is of particular technical significance. The copper layer finds utility as a conducting track layer, electrode layer, sensor layer, or as a bonding layer when the aluminum oxide ceramic is soldered as a heat sink to other, heat-evolving devices.

There are basically two different processes in existence for directly applying copper to the ceramic material. DE-A-3 824 249 describes a process comprising electroless deposition following prior roughening of the ceramic surface and a subsequent palladium nucleation followed by heat treatment, while DE-A-3 036 128 relates to a direct copper bonding (DCB) process wherein copper plating from 100 to 900 μm in thickness is applied to the ceramic surface at about 1070° C. Both processes are technically complicated and, in addition, are not suitable for producing copper structures of a very precise geometry because of the necessary roughening of the ceramic or because of the thickness of the copper layer. Moreover, the ceramic-copper bonds produced by the existing processes are of only very limited usefulness in high frequency technology.

For this reason a frequently adopted approach has been to apply the basic metal layer by the method of cathode sputtering in a vacuum, hereinafter simply referred to as sputtering.

However, it has been known for a long time that copper applied by this technique to ceramic shows only very poor adhesion. For this reason it has been common for some years to interpose between the ceramic and the copper a thin layer, a few 10 to 100 nm in thickness, of a coupling agent comprising a reactive metal applied by sputtering. The usual coupling agents used are metals such as chromium, titanium, nickel, tantalum, tungsten, and alloys such as TiW or NiCr. Although these metallic coupling agents result in an excellent adhesion of 50 MPa or more, this technique has two crucial disadvantages. First, the sputter coater must contain two separately controllable targets, namely the coupling agent and copper. Secondly, the later structuring of the metal layer requires an additional etching step, since none of the coupling agents is structurable with an etching medium suitable for copper. There is yet a further disadvantage in that the etching media for the coupling agents are usually very aggressive and hence very difficult to handle, particularly on a industrial scale.

OBJECT OF THE INVENTION

It is an object of the present invention to sputter elemental copper on aluminum oxide ceramic with firm adhesion without the need for a interlayer of coupling agent.

SUMMARY OF THE INVENTION

This object is achieved by a process which comprises first subjecting the aluminum oxide surface to a plasma etching process in a vacuum and immediately thereafter plating the plasma etched surface with copper by sputtering.

BRIEF DESCRIPTION OF THE DRAWING

The invention will now be more particularly described by way of example with reference to the accompanying diagram. The diagram depicts how adhesion of copper to aluminum oxide substrates within the range from 30 to 52 MPa can be achieved as a function of the etching time, the etching power, and the atmosphere.

DETAILED DESCRIPTION OF THE INVENTION

For the purposes of the present invention a plasma etching process comprises striking a high frequency gas discharge above the substrates. Prior to the plasma etching process the ceramic is preferably subjected to a cleaning process, in particular in isopropanol in an ultrasonic bath or in hot sulfuric acid, at a temperature within the range from 120° to 180° C., to remove any organic contamination from the surface. After drying at temperatures of about 200° C. the ceramic substrate is introduced into a vacuum chamber fitted with a plasma etcher. The chamber is evacuated down to about $10^{-3}$ Pa, at which point oxygen or argon is introduced as process gas so that the chamber comes to an equilibrium pressure of from 0.1 to 3 Pa, preferably of from 0.5 to 2.0 Pa. Then a high frequency gas discharge is struck above the substrates. According to the invention, the best adhesion is achieved when this plasma etching process takes place over a time span within the range from 15 to 30 minutes in oxygen at a power density of from 0.2 to 1.0 W/cm, preferably of from 0.4 to 0.8 W/cm, although good adhesion is attainable at lower power and with argon as process gas by plasma etching for at least 15 minutes.

The term "immediately thereafter" means for the purposes of the present invention that between the plasma etching process and the sputtering process the plasma etched surface does not come into contact with air or other troublesome gases. It is therefore immediately following the plasma etching process that the plasma etched substrate is introduced into a second, immediately adjoining vacuum chamber in which the copper plating by sputtering is to take place. The basic vacuum in this chamber is preferably $10^{-5}$ Pa, and the copper plating can be sputtered on in thicknesses of from 100 nm to 10 μm. The process parameters of copper sputtering are common knowledge, although in industrial practice a dynamic plating under an argon pressure of 1 Pa and at a deposition rate of about 0.25–0.5 m/min has proved best.

Using the above-described plasma etching process it is possible according to the invention to achieve an adhesion of up to about 50 MPa, measured by perpendicular peeling on the line of German standard specification DIN 50160. The process results in adhesion strengths of at least 30 MPa, and generally within the range from 35 to 50 MPa. These figures greatly exceed the adhesion values required, as mentioned above (usually > 30 MPa).

Following the novel basic metallization of the aluminum oxide ceramic with copper without coupling agent it is possible, if necessary, to effect further electro-thickening of the copper layer and/or structuring of the conducting path, electrode, sensor, or soldering layers by commonly known techniques. Suitable options are in particular:

Direct structuring by means of the photoresist technique, provided the sputtered layer has an adequate thickness of at least 300 nm.

Direct structuring by means of the laser technique, provided the sputtered layer has an adequate thickness of at least 300 nm.

Uniform electroplating to the desired thickness and subsequent structuring by means of the laser technique.

Uniform electroplating to the desired thickness and subsequent structuring by means of the photoresist technique ("subtractive technique").

Patterning with photoresist, electroplating, stripping the photoresist and differential etching ("semiadditive technique").

The procedures all have in common that, if the copper plating technique of the invention is employed, a separate etching step for removing a coupling agent will no longer be necessary as part of the intended subsequent structuring.

What is claimed is:

1. A process for preparing a firm bond between a copper layer applied by sputtering and aluminum oxide ceramic, comprising the steps of:
    a) introducing the ceramic into a first vacuum chamber fitted with a plasma etching apparatus and evacuating the chamber down to $10^{-3}$ Pa;
    b) introducing oxygen into the chamber so that the chamber comes to an equilibrium pressure of from 0.1 to 3 Pa;
    c) striking a high frequency gas discharge above the ceramic, thereby plasma etching its surface;
    d) introducing immediately thereafter the plasma etched ceramic into a second vacuum chamber and plating the plasma etched surface with copper by sputtering.

2. The process of claim 1, wherein the ceramic is subjected to a cleaning process prior to the plasma etching process.

3. The process of claim 2, wherein the cleaning process is carried out with isopropanol in an ultrasonic bath.

4. The process of claim 2, wherein the cleaning process is carried out in hot sulfuric acid at temperatures within the range from 120° to 180° C.

5. The process of claim 2, wherein the ceramic is subjected to drying at temperatures of about 200° C. following the cleaning process.

6. The process of claim 1, wherein the introduction of oxygen into the chamber results in an equilibrium pressure of from 0.5 to 2 Pa.

7. The process of claim 6, wherein the plasma etching takes place over a period within the range from 15 to 30 minutes and at a power density of from 0.2 to 1.0 W/cm.

8. The process of claim 7, wherein, the copper layer has an adhesion strength within the range from 35 to 50 MPa, measured by perpendicular peeling according to German Standard Specification DIN 50160.

9. The process of claim 7, wherein the power density is from 0.4 to 0.8 W/cm.

10. The process of claim 1, wherein the plasma etching takes place over a period within the range from 15 to 30 minutes and at a power density of from 0.2 to 1.0 W/cm.

11. The process of claim 10, wherein, the copper layer has an adhesion strength within the range from 35 to 50 MPa, measured by perpendicular peeling according to German Standard Specification DIN 50160.

12. The process of claim 10, wherein the power density is from 0.4 to 0.8 W/cm.

13. The process of claim 1, wherein, the copper layer has an adhesion strength of at least 30 MPa, measured by perpendicular peeling according to German Standard Specification DIN 50160.

* * * * *